United States Patent [19]
Ikeya

[11] Patent Number: 5,929,552
[45] Date of Patent: Jul. 27, 1999

[54] ULTRASONIC VIBRATOR

[75] Inventor: Masaki Ikeya, Aichi, Japan

[73] Assignee: Aisan Kogyo Kabushiki Kaisha, Aichi, Japan

[21] Appl. No.: 08/907,855

[22] Filed: Aug. 8, 1997

[30] Foreign Application Priority Data

Dec. 9, 1996 [JP] Japan ..................... 8-328261

[51] Int. Cl.$^6$ ................................. H01L 41/08
[52] U.S. Cl. ........................... 310/325; 310/323
[58] Field of Search ..................... 310/323, 325, 310/328

[56] References Cited

U.S. PATENT DOCUMENTS

| | | | |
|---|---|---|---|
| 3,694,675 | 9/1972 | Loveday | 310/325 |
| 3,789,183 | 1/1974 | Conley | 310/325 X |
| 4,352,459 | 10/1982 | Berger et al. | 310/325 X |
| 5,508,580 | 4/1996 | Maeno et al. | 310/323 |

*Primary Examiner*—Mark O. Budd
*Attorney, Agent, or Firm*—Koda & Androlia

[57] ABSTRACT

An ultrasonic vibrator which is preferable for transporting a small flow rate of powder is realized. A leaked vibrating energy is reduced to increase an efficiency of the device. A variation in performance influenced by the supporting process is eliminated to attain a stable performance. A vibrating amplitude at the horn part acting against the powder is increased. An AC voltage is applied to the piezo-electric elements through the electrodes. The vibrator may generate a complex vibration of the primary extending or retracting vibration and a secondary flex vibration, a lower end of the horn part is rotationally vibrated at an elliptical orbit indicated. The elliptical orbit has an elongated diameter extending in a lateral direction. The vibrator is made such that the inserting end of the shaft having the upper end flange part fixed thereto supports a section of the complex vibration of the vibrator. The powder fed from the resilient tube is promoted in a leftward direction as viewed in the figure under an elliptical motion of the bottom surface of the hole.

2 Claims, 6 Drawing Sheets

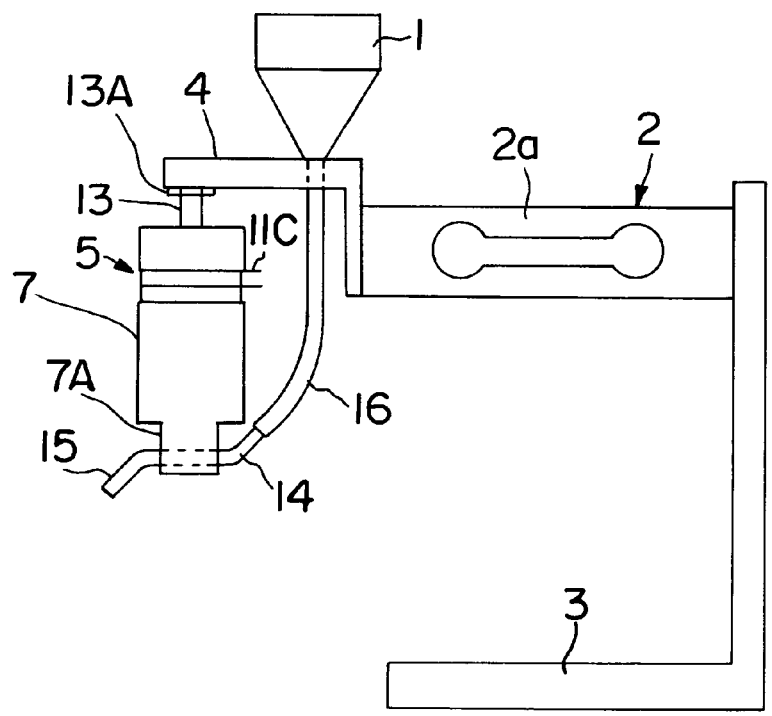
F I G. 3
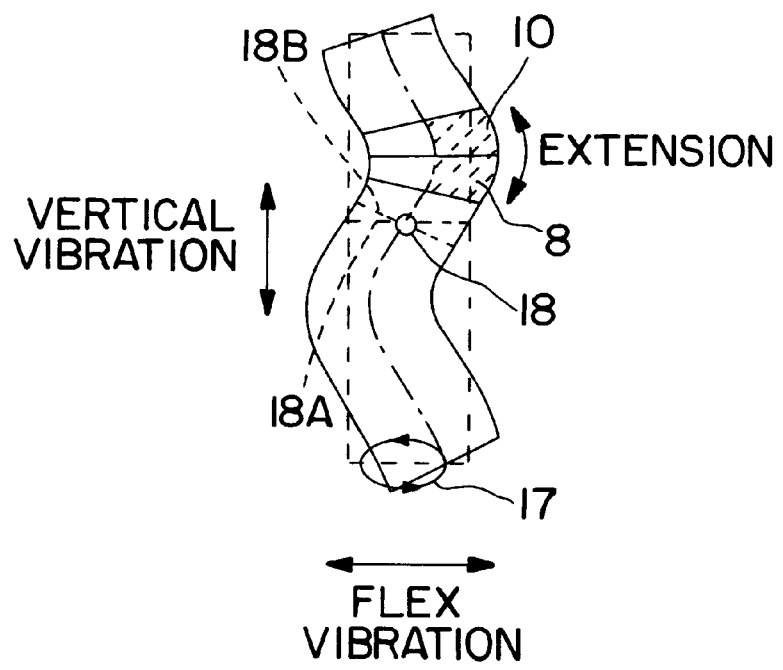
F I G. 4

ULTRASONIC VIBRATOR

BACKGROUND OF THE INVENTION

1. Field of the Invention

This invention relates to an ultrasonic vibrator which is suitable for transporting a small flow rate of powder.

2. Description of the Related Art

It is well known in a gazette of Japanese Patent Laid-Open No. Hei 7-33228 to provide a powder transporting device comprising a transporting cylinder of which upstream end is connected to an outlet of a powder hopper to form a power transporting passage and an ultrasonic driving device (an ultrasonic vibrator) using a bolt fastened Langevin type vibrator and applying an ultrasonic vibration showing an elliptical orbit to powder kept in the transporting passage (hereinafter called as a first prior art).

In this type of powder transporting device, the powder hopper and the ultrasonic vibrator are supported by a supporting member such as a frame or the like.

The ultrasonic vibrator is made such that upper and lower metallic blocks having a substantial circular cylinder are connected by metallic bolts. Then, a ring-like electrode, a first ring-like piezo-electric element, a pair of ring-like divided electrodes and a second ring-like piezo-electric element are held in sequence from a lower stage between both metallic blocks while being fitted to the bolts.

In addition, it is also well known in the art to provide an ultrasonic vibrator by a gazette of Japanese Patent Laid-Open No. Hei 7-155687 that both blocks are connected by a connecting rod under a state in which the ring-like piezo-electric elements are being held between a pair of blocks, a periodically varying voltage is applied to the piezo-electric elements to generate a complex vibration composed of a vertical vibration and a flex vibration, wherein the connecting rod is formed with an axial hole therein, a fixing shaft positioned with a certain clearance in respect to an inner wall of the hole is inserted into the hole, and an inserting end of the fixing shaft is fixed to the ultrasonic element at a section of a complex vibration of the ultrasonic vibrator (hereinafter called as a second prior art).

In this second prior art, the electrodes for applying a periodically varying voltage to the piezo-electric elements are composed of divided electrodes which are equally divided into four segments in a circumferential direction of the ring-like piezo-electric elements, any one of the four divided electrodes is selectively used to enable a vibrating plane of the flex vibration to be changed over and it is supported at a location where it becomes a section of complex vibration in common irrespective of any type of vibrating plane of the flex vibration. Accordingly, a resonant phenomenon is always generated irrespective of the vibrating plane to enable a stable ultrasonic vibration to be attained.

In the aforesaid first prior art, since an ultrasonic vibration showing an elliptical orbit is applied to powder through an elliptical motion of an extremity end of a horn part formed at an upper end of an upper metallic block, it can be provided that a lower end of a lower metallic block is fixed to the supporting member in order to support the ultrasonic vibrator by the supporting member such as a frame or the like.

Although no description is found in the aforesaid first prior art about a practical supporting structure for the ultrasonic vibrator, there were some problems that supporting of a lower end of the lower metallic block may cause a vibrating energy leaked from the ultrasonic vibrator through the supporting part to be increased, a high amount of driving electrical power is required for applying an elliptical orbit of desired value and an efficiency of the ultrasonic vibrator is decreased.

In addition, in the aforesaid second prior art, the electrode was divided electrodes which are equally divided into four segments in a circumferential direction, wherein a circumferential angle of one electrode is about 90°, resulting in that the driving electrical power could not be effectively utilized and so an efficiency of the ultrasonic vibrator could not be well realized.

SUMMARY OF THE INVENTION

In view of the foregoing, it is an object of the present invention to provide an ultrasonic vibrator capable of eliminating these problems found in the aforesaid prior art, and more particularly an ultrasonic vibrator which is preferable to be used for transporting a small amount of powder.

In order to accomplish the aforesaid object, there is provided a bolt fastened Langevin type vibrator in which a first metallic block of substantial circular cylinder and a second metallic block of substantial circular cylinder are connected coaxially with a connecting rod with their axes being set in a vertical orientation, and two ring-like piezo-electric elements and semi-annular electrodes are held between both metallic blocks, an improvement in which:

the connecting rod is provided with a hole extending along its axis;

a supporting shaft is inserted in the hole with a clearance in respect to the inner wall of the hole;

the inserting end of the supporting shaft is fixed to the vibrator and the base end of the supporting shaft is projected to pass through a hole arranged along the axial center of the first metallic block;

the base end of the supporting shaft is held in such a way that the axial centers of both blocks are placed vertically with the first metallic block being placed above the second metallic block, the lower end of the second metallic block is formed with a horn part in which its width is set to be smaller than the outer diameter of the second metallic block and its direction toward the width is directed toward the central direction of a circumferential angle of the semi-annular electrode;

the extremity end of the horn part is provided with a powder transporting hole toward the width direction; and an AC voltage is applied to the both piezo-electric elements, to cause a primary resonant vibration of an extending or retracting vibration and a secondary resonant vibration of a flex vibration to be produced at the vibrator, and the inserting end of the supporting shaft is substantially fixed to the vibrator on a line where a plane acting as a section of the extending or retracting vibration and a plane acting as a section of the flex vibration are crossed to each other.

In the present invention, as an AC voltage is applied to the ring-like piezo-electric elements through semi-circular electrodes, the vibrator may generate the primary resonant vibration of an extending or retracting vibration and the secondary resonant vibration of a flex vibration to cause the extremity end of the horn part to perform an elliptical motion, although an amplitude of vibration in a horizontal direction along an axial center of the hole for transporting powder which is a direction of the width (W) of the horn part in particular.

Then, a leakage of vibrating energy through the supporting shaft is less in its amount and the ultrasonic vibrator can be efficiently vibrated.

In the above-mentioned ultrasonic vibrator, a hole of the horn part of the vibrator is communicated with the downstream end of the powder supplying tube made of resilient material where its upstream end is connected to an outlet of the powder hopper for use in guiding the powder to the powder transporting hole arranged at the horn part.

In the present invention, powder guided to the powder transporting hole through the powder supplying tune is promoted and transported in one direction by a gravity weight applied to the powder and an elliptical motion at an inner wall of a lower surface of the hole.

Although a downstream end of the powder supplying tube is vibrated together with the horn part, it is formed by resilient material, so that it is easily deformed. Due to this fact, it may not prohibit vibration of the ultrasonic vibrator.

BRIEF DESCRIPTION OF THE DRAWINGS

FIG. 3 is a front elevational view for showing a mechanism of a powder transporting device using the ultrasonic vibrator in the first preferred embodiment of the present invention.

FIG. 4 is an illustrative view for showing a vibrating mode of the ultrasonic vibrator of the present invention.

DETAILED DESCRIPTION OF THE PREFERRED EMBODIMENTS

Figure 1A:
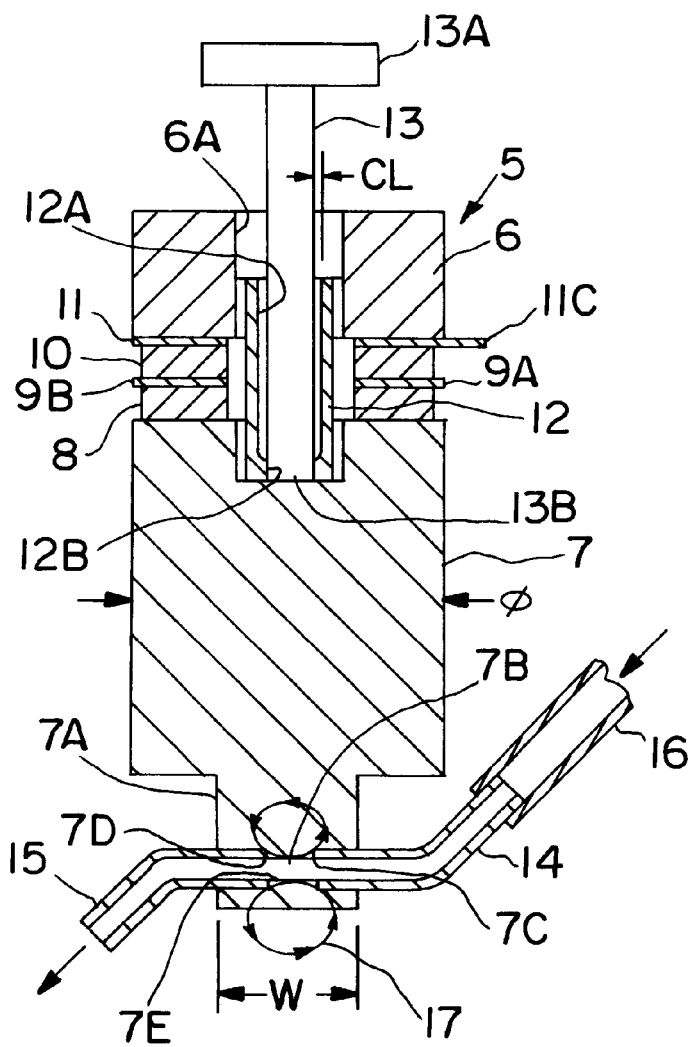
FIG. 1(a) is a longitudinal section of a first preferred embodiment of the present invention and FIG. 1(b) is a top plan view for showing an electrode and a spacer.

Referring now to the drawings, the preferred embodiments of the present invention will be described as follows.

At first, in the first preferred embodiment shown in FIGS. 1(a), 1(b), 2(a), 2(b) and 3, a powder hopper 1 is provided with an arm 2a having a weight sensor composed of a strain gauge type sensor, and supported by a supporting member 4 having its base end (a right side as viewed in the figure) fixed to an extremity end (a left end as viewed in the figure) of the weighting device 2 attached to a base block 3.

Figure 2A:
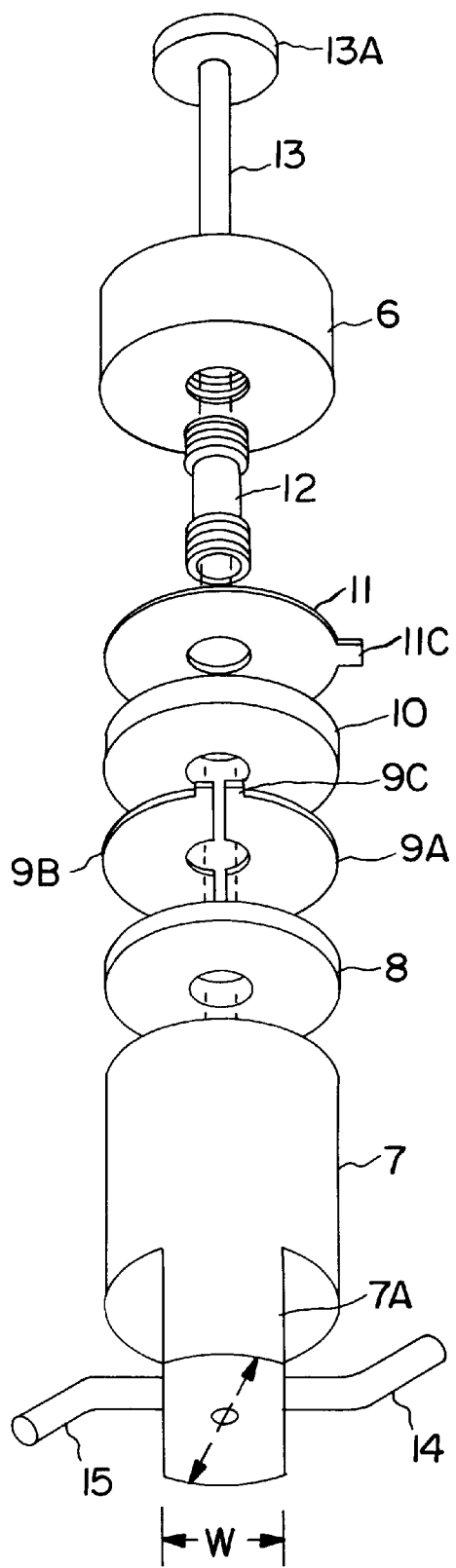
FIG. 2(a) is an exploded perspective view of the preferred embodiment shown in FIG. 1(a) and FIG. 2(b) is a top plan view for showing a shape of each of the electrode and the spacer before they are assembled.

As shown in the exploded view in FIG. 2(a), the ultrasonic vibrator 5 is constructed such that a ring-like piezoelectric element (PZT) 8, a semi-circular electrode 9A, a semi-circular spacer 9B, a ring-like piezo-electric element (PZT) 10 and a ground electrode 11 are held between a first aluminum block 6 of substantial circular cylinder and a second aluminum block 7 of substantial circular cylinder, wherein both blocks 6 and 7 are connected to each other by a connecting rod 12 having an axial hole 12A therein.

The connecting rod 12 is made of conductive metal and has male threads at its both upper and lower ends and these threads are tightly fastened with screws to the female threads formed on the axes of both blocks 6 and 7.

Figure 2B:
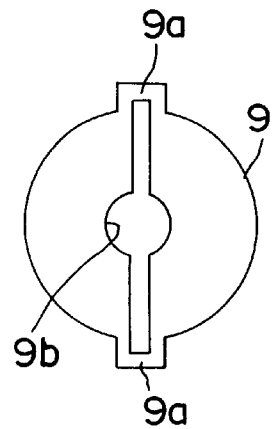

At a stage before assembling as the ultrasonic vibrator 5, the electrode 9A and the spacer 9B are formed into an annular shape made of one sheet having a hole 9b therein and when they are assembled, the connecting rod 12 may pass through the hole 9b as indicated by a symbol 9 in FIG. 2(b) with a certain clearance.

Then, after assembling operation, the portions 9a shown in FIG. 2(b) are cut and divided into two segments, whereby the semi-annular electrode 9A and the spacer 9B are formed and at the same time a position setting in assembling each of the electrode 9A and the spacer 9B may easily be carried out.

The electrode 9A is projected with and formed with an electricity supplying terminal part 9C. Also the ground electrode 11 is projected with and formed with an electricity supplying terminal 11C.

Each of the piezo-electric elements 8, 10 and the ground electrode 11 is entirely formed into a substantial annular shape and the connecting rod 12 is passed through the central holes with a certain clearance.

The supporting shaft 13 is integrally formed with a fixing flange 13A at its upper end base portion, the lower end of the supporting shaft 13 is passed through the central hole 6A of the aluminum block 6, inserted into the hole 12A of the connecting rod 12 (refer to FIG. 1(a), its lower end i.e. the inserting end 13B is press fitted and fixed to a small diameter part 12B of the lower end of the hole 12A of the connecting rod 12. In this way, the lower end of the supporting shaft 13, i.e. the inserting end 13B is fixed substantially to the second aluminum block 7 through the connecting rod 12.

As shown in FIG. 3, the upper end flange 13A of the supporting shaft 13 is directly fixed to the supporting member 4 with some rivets or the like so as to vertically support the vibrator 5.

Figure 1B:
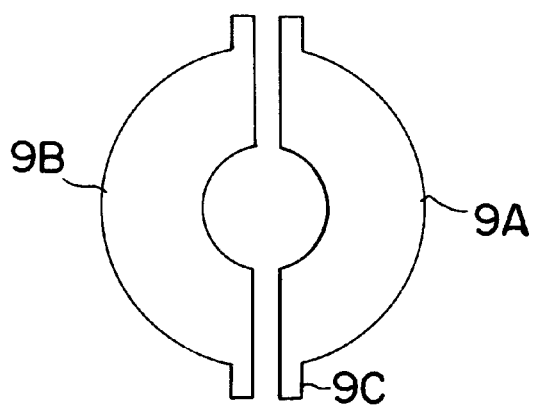

As shown in the figure, the electrode 9A is arranged at an axial right side of the ultrasonic vibrator 5, and the spacer 9B is arranged at an axial left side of the ultrasonic vibrator 5 from each other (FIG. 1(b)). An AC voltage is applied to the terminal 9C of the electrode 9A and the terminal 11C of the ground electrode 11, an AC voltage is applied to the right half sides of the ring-like piezo-electric elements 8, 10 so as to cause the ultrasonic vibrator 5 to be energized.

The lower end of the second aluminum block 7 is made such that a lateral width W as viewed in the figure is recessed to have a size approximately half of ϕ35 mm of an outer diameter of the aluminum block 7 so as to form a horn part 7A. In addition, each of the outer diameter of the first aluminum block 6, the electrode 9A, the spacer 9B and ground electrode 11 is set to ϕ35 mm which is the outer diameter of the second aluminum block 7. The outer diameters of each of the piezo-electric elements 8 and 10 are made to be slightly smaller than the outer diameters of each of the aluminum blocks 6, 7 or electrodes 9A, 11 in such a way that they may not be contacted with burrs of the adjoining component parts.

The horn part 7A forms a so-called deformed step horn in this way, wherein a direction of its width W is formed toward a central direction of a circumferential angle (about 180°) of the semi-annular electrode 9A, i.e. a lateral direction as viewed in the figure.

Further, the extremity end of the horn part 7A is provided with a hole 7B for use in transporting powder in the aforesaid direction of width W. To this hole 7B is press fitted and fixed each of ends of the metallic pipes 14, 15 having an outer diameter of about 4 mm. In order to set accurate positions of the press-fitting ends of the pipes 14, 15, the hole 7B at the horn part 7A is provided with some stepped segments designated by symbols 7C, 7D shown in FIG. 1(*a*), and further both pipes 14, 15 are press fitted to the hole 7B of the horn part 7A in such a way that each of the ends of the pipes 14, 15 is abutted against these stepped segments 7C, 7D.

Accordingly, a central part of the hole 7B passing through the horn part 7A in a direction of the width W (a lateral direction as viewed in the figure) is formed with a small diameter part indicated by a reference symbol 7E in FIG. 1(*a*), and an inner diameter of the small diameter part 7E and an inner diameter of each of the pipes 14, 15 are set to the same inner diameter of φ3.5 mm.

Between an inlet of one pipe 14 and an outlet of a lower end of the powder hopper 1 is connected by a resilient powder supplying tube 16 made of Teflon.

The ultrasonic vibrator 5 is operated such that an AC voltage of about 30 kHz is applied between the terminals 9C, 11C to perform its driving and energization, resulting in that the piezo-electric elements 8 and 10 may generate a non-symmetrical extension or retraction, both the primary extension or retraction vibration (a vertical vibration) and the secondary flex vibration (a bending vibration) are concurrently generated, the two kinds of vibrations are made as a composite vibration and a rotational vibration showing an elliptical orbit with a vertical amplitude and a lateral amplitude being applied as a minor diameter and a major diameter is produced at the horn part 7A of the extremity end having the largest amplitude.

This value of 30 kHz of a driving frequency is defined as a frequency which is resonated to the primary extending or retracting vibration and the secondary flex vibration of the ultrasonic vibrator 5, and a shape of the vibrator is defined as such a shape as one for generating a rotating vibration drawing the aforesaid elliptical orbit in reference to a resonant frequency.

FIG. 4 is a composite vibration of the vertical vibration and the flex vibration, wherein a state for generating an elliptical orbit indicated by a reference symbol 17 at its extremity end (a lower end as viewed in the figure) is exaggeratively indicated. In this figure, an illustration of the horn part 7A is eliminated in order to expand an amplitude of the lower end (extremity end) of the vibrator.

In addition, a point indicated by a reference symbol 18 in this figure is a point of common section for both the primary extending or retracting vibration and the secondary flex vibration and this is placed on a line where a plane 18A becoming a section of the primary extending or retracting vibration and a plane 18B becoming a section of the secondary flex vibration are crossed to each other. Fixing positions of the inserting end 13B of the aforesaid supporting shaft 13 and the small-diameter part 12B of the connecting rod 12 are provided in compliance with a position becoming a common section indicated by a reference symbol 18, whereby a vibrating energy leaked from the supporting rod 12 can be reduced and an efficiency of the ultrasonic vibrator can be set to be the most superior efficiency.

Figures 5A, 5B, 5C, 5D:
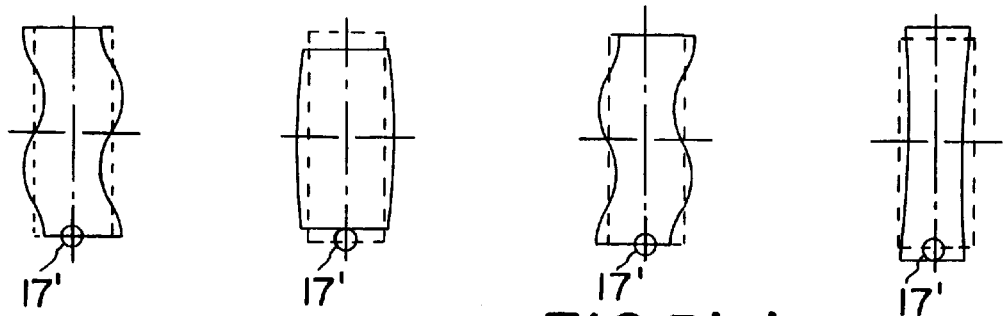
FIGS. 5(a) to 5(d) are illustrative views each showing a variation in time in a vibration mode.

FIGS. 5(*a*), 5(*b*), 5(*c*) and 5(*d*) illustrate in an exploded manner a process in which a rotational vibration of an elliptical orbit is produced by a composite formation of the primary extending or retracting vibration and the secondary flex vibration during one period of the driving voltage. In these figures, since the shape of the vibrator is drawn as a simple of a circular cylinder having no horn part, the elliptical orbit 17' has a smaller diameter (amplitude) in a lateral direction as shown in the figures as compared with that of the aforesaid elliptical orbit 7.

Powder fed into the hole 7B from the powder hopper 1 through the powder supplying tube 16 and the pipe 14 is pushed against the pipes 14, 15 and the small diameter part of the hole 7B by its own weight, driven by friction caused by the vibration indicated by the elliptical orbit 17, and then the powder is promoted from the pipe 14 toward a direction of the pipe 15 (a leftward direction as viewed in the figure) as indicated by an arrow in FIG. 1(*a*).

The horn part 7A formed with its relative orientation in respect to the electrode 9A may effectively amplify an amplitude of the elliptical orbit 17, in particular, an amplitude in a lateral direction as viewed in the figure so as to promote forcedly a transportation of the powder.

In addition, since the horn part 7A has a larger amplitude as it is approached to its extremity end (a lower end), its bottom surface shows a larger amplitude as compared with that of a ceiling part of the hole 7B. Accordingly, the powder press contacted with the bottom surface of the hole 7B by its own weight is promoted toward a left side in the most effective manner.

As the AC voltage applied to the electrode is terminated, the ultrasonic vibration, is stopped and the promotion of the powder is also stopped.

A weight calculated with a weighing device 2 can be utilized as a signal of a loss-in-weight type powder supplying device for calculating a flow rate of powder in reference to a reducing amount per unit time by a control device not shown, adjusting a driving electrical power of the ultrasonic vibrator and feed-back controlling a flow rate of powder to a target flow rate.

In the case that the ultrasonic vibrator 5 is activated in order to transport the metallic powder with a particle diameter of 100 μm in the aforesaid preferred embodiment, it is possible to realize a stable flow rate within a range of flow rate of 0.05 to 2.00 [g/s] and so its responding time can be set to about 0.2 second.

In the case that such a small flow rate of powder of small diameter is transported, it is not required to have such a high promoting force as one above, but it is effective to increase an amplitude of the elliptical orbit 17 in a horizontal direction. In this embodiment, it can be realized by setting a shape and an orientation of the horn part 7A as described above. Further, since the inserting end 13B of the supporting shaft 13 is substantially fixed to a common section between the extending or retracting vibration and the flex vibration, an energy loss is reduced and an efficiency of the vibrator can be increased.

In addition, since the piezo-electric elements 8 and 10 perform non-symmetrical extending or retracting operation, in the case that the point of the common section between the primary extending or retracting vibration and the secondary flex vibration is not positioned at an axial center (center) but displaced, it can be adjusted by changing a shape of the horn part and by changing a ratio between a vertical size and a lateral size of the vibrator.

Figure 6:
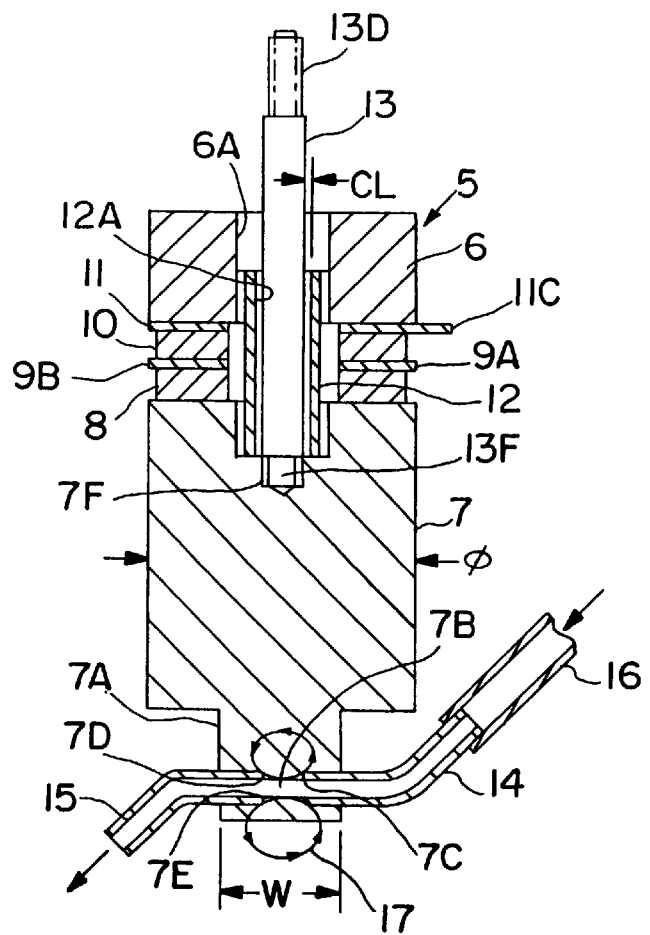
FIG. 6 is a longitudinal section for showing a second preferred embodiment of the present invention.
Figure 7:
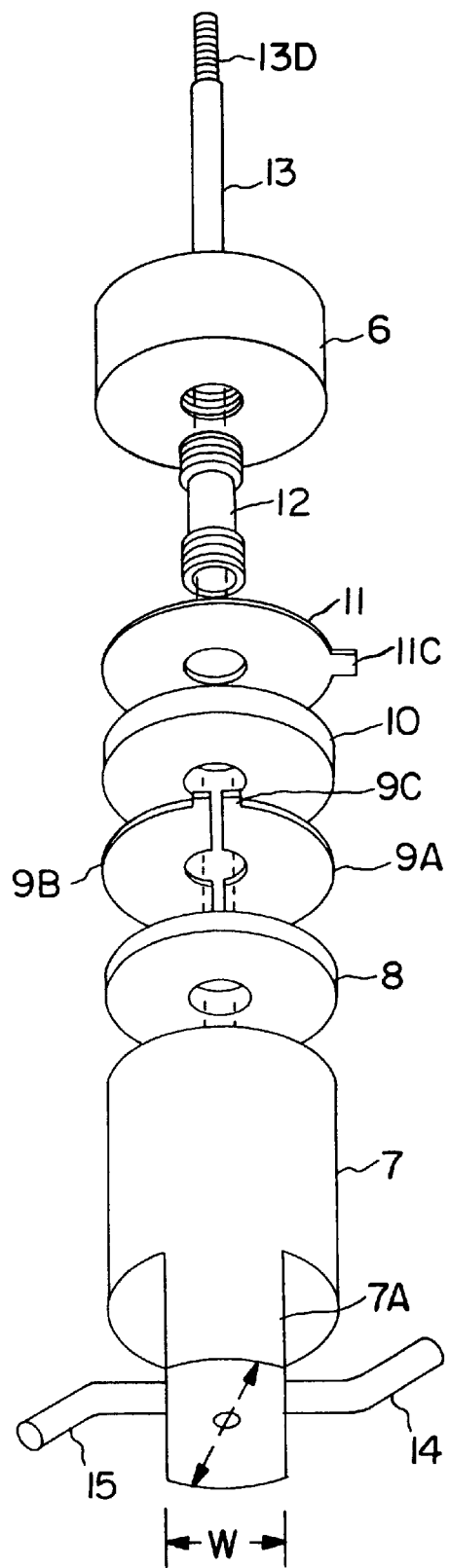
FIG. 7 is an exploded perspective view for showing a second preferred embodiment of the present invention.
Figure 8:
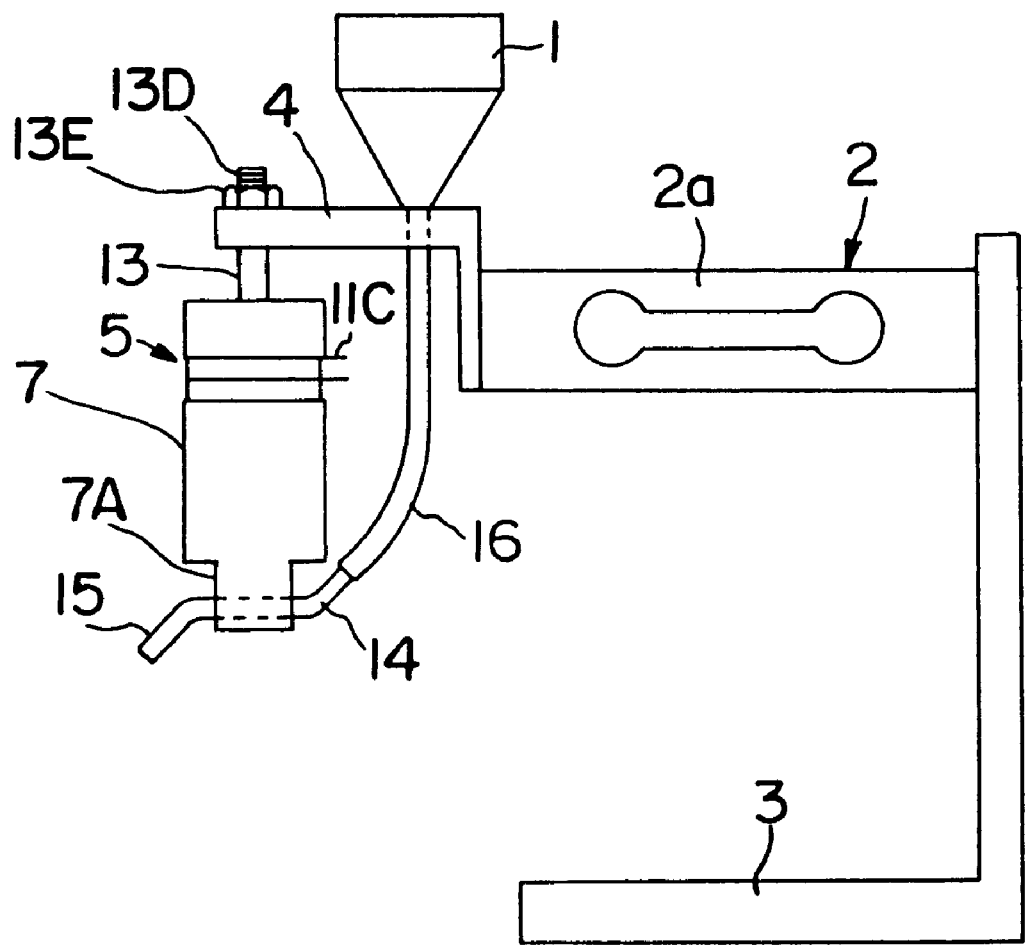
FIG. 8 is a front elevational view for showing a mechanism of a powder transporting device using the ultrasonic vibrator in the second preferred embodiment of the present invention.

FIGS. 6 to 8 illustrate a second preferred embodiment of the present invention, wherein a male thread 13D is formed at an upper part of the supporting shaft 13 in place of the upper end flange 13A of the supporting shaft 13 in the aforesaid first preferred embodiment, the male thread 13D is inserted into the supporting member 4 and threadably fixed by a nut 13E as shown in FIG. 8, the vibrator 5 is supported vertically, and a fixing between the aforesaid supporting shaft 13 and the second aluminum block 7 is performed in place of the fixing of the connecting rod 12 in the aforesaid first preferred embodiment such that a male thread 13F is formed at the lower part of the supporting shaft 13 and the thread is threadably fixed to a female thread 7F formed at the second aluminum block 7 so as to fix the supporting shaft 13 and the second aluminum block 7.

The supporting shaft 13 is supported to the supporting member 4 by the thread 13D as in the second preferred embodiment of the present invention, whereby an absorption of vibration is made low, an efficiency of the vibrator 5 is improved, and further the lower part of the supporting shaft 13 is connected with screws 13F and 7F in such a way that they may be separated, then a replacement of the supporting shaft 13 may easily be carried out in reference to the machine type of the powder processing device.

Other structures in the second preferred embodiment of the present invention are similar to the structures in the aforesaid first preferred embodiment, so that the same component parts as those of the aforesaid first preferred embodiment are affixed with the same reference symbols and their description will be eliminated.

As the ultrasonic vibrator of the present invention is constructed as described above, a leakage of vibrating energy from the supporting part is less, an efficiency of the ultrasonic vibrator is increased and an amplitude of the elliptical motion caused by a complex combination of the primary extending or retracting vibration and the secondary flex vibration can be effectively increased. In addition, the elliptical motion can be effectively utilized in the transportation of the powder. Further, it is also possible to eliminate a variation in performance in reference to the supporting method and to attain a stable performance.

What is claimed is:

1. A bolt fastened Langevin type vibrator in which a first metallic block of substantial circular cylinder and a second metallic block of substantial circular cylinder are connected coaxially with a connecting rod with their axes being set in a vertical orientation, and two ring-like piezo-electric elements and semi-annular electrodes are held between both metallic blocks, an improvement in which:

said connecting rod is provided with a hole extending along its axis;

a supporting shaft is inserted in the hole with a clearance in respect to the inner wall of the hole;

the inserting end of the supporting shaft is fixed to the vibrator and the base end of the supporting shaft is projected to pass through a hole arranged along the axial center of the first metallic block;

said base end of the supporting shaft is held in such a way that the axial centers of both blocks are placed vertically with the first metallic block being placed above the second metallic block, the lower end of the second metallic block is formed with a horn part in which its width is set to be smaller than the outer diameter of the second metallic block and its direction toward the width is directed toward the central direction of a circumferential angle of said semi-annular electrode;

the extremity end of the horn part is provided with a powder transporting hole toward said width direction; and an AC voltage is applied to said both piezo-electric elements, to cause a primary resonant vibration of an extending or retracting vibration and a secondary resonant vibration of a flex vibration to be produced at the vibrator, and said inserting end of the supporting shaft is substantially fixed to the vibrator on a line where a plane acting as a section of the extending or retracting vibration and a plane acting as a section of the flex vibration are crossed to each other.

2. The ultrasonic vibrator as set forth in claim 1, an improvement in which a hole of the horn part of the vibrator is communicated with the downstream end of the powder supplying tube made of resilient material where its upstream end is connected to an outlet of the powder hopper for use in guiding the powder to the powder transporting hole arranged at said horn part.

* * * * *